United States Patent
Holmqvist

[19]

[11] Patent Number: 5,818,888
[45] Date of Patent: Oct. 6, 1998

[54] SAMPLE RATE CONVERTER

[75] Inventor: Peter Bo Holmqvist, Morrisville, N.C.

[73] Assignee: Ericsson, Inc., Research Triangle Park, N.C.

[21] Appl. No.: 806,853

[22] Filed: Feb. 26, 1997

[51] Int. Cl.⁶ .................................................. H03M 7/00
[52] U.S. Cl. ........................ 375/355; 341/61; 364/724.1
[58] Field of Search ..................... 375/350, 355; 341/61; 364/724.1

[56] References Cited

U.S. PATENT DOCUMENTS

| | | | |
|---|---|---|---|
| 4,020,332 | 4/1977 | Crochiere et al. | 364/723 |
| 4,692,931 | 9/1987 | Ohsawa | 372/355 |
| 5,432,511 | 7/1995 | Sadjadian et al. | 341/61 |
| 5,481,267 | 1/1996 | Miyabe et al. | 341/61 |
| 5,497,152 | 3/1996 | Wilson et al. | 341/61 |
| 5,512,895 | 4/1996 | Madden et al. | 341/61 |
| 5,513,209 | 4/1996 | Holm | 375/354 |
| 5,559,513 | 9/1996 | Rothermel et al. | 341/61 |
| 5,596,609 | 1/1997 | Genrich et al. | 375/350 |
| 5,606,319 | 2/1997 | Yatim et al. | 341/144 |
| 5,610,942 | 3/1997 | Chen et al. | 375/242 |
| 5,617,088 | 4/1997 | Yasuda | 341/61 |
| 5,621,404 | 4/1997 | Heiss et al. | 341/61 |
| 5,731,769 | 3/1998 | Girardeau, Jr. et al. | 341/61 |

*Primary Examiner*—Young T. Tse
*Attorney, Agent, or Firm*—Rhodes, Coates & Bennett, L.L.P.

[57] ABSTRACT

A sample rate converter is described for converting an input data stream including a plurality of input samples at one sample rate to an output data stream including a plurality of output samples at another sample rate. The converter uses an interpolation approach that utilizes an integer accumulator to track the timing relation between input samples and output samples. Based on the value of the accumulator, the method determines if the correct input samples are being used to calculate the current output sample. If so, the output sample is calculated as a function of the input samples and the accumulator value. The converter provides the robustness of a table based conversion approach without the need to pre-calculate and store a table, simplifies the calculations involved, and is less sensitive to numeric round off errors.

19 Claims, 7 Drawing Sheets

SAMPLE RATE CONVERTER

FIELD OF THE INVENTION

This invention relates to the field sample rate converting of digital signals. More particularly, the present invention relates to a sample rate conversion method that employs an integer accumulator to calculate the timing relation of input and output samples.

BACKGROUND OF THE INVENTION

In many electronic applications, signals are represented and processed digitally. Digital words, or samples, represent the value of the data at a regular time interval. This regular interval is often referred to as the sample rate, and is typically expressed in units of kilohertz (kHz) representing the reciprocal of the sample interval time period.

There are situations when the available sample rate of the data is different from the desired sample rate. Depending on the characteristics of the sample data and how much the available and desired rates differ, several approaches may be used to convert the signal at one sample rate to a signal at another sample rate without intentionally altering the meaning of the signal.

A first common technique for sample rate reduction is called decimation. It is the method of choice when the available sample rate is an integer multiple of the desired sample rate. The decimator reduces the input sample rate by an integer number d to create an output sample rate. If the input signal contains high frequency components, they must be first removed by a low pass filter to avoid aliasing effects. The rate reduction is performed by simply discarding d−1 input samples for every d:th output samples.

The main drawback of decimation is that the rate reduction is limited to an integer number. In addition, an anti-aliasing filter, if necessary, may be very computationally intensive.

A second common technique for sample rate conversion is known as interpolation. Interpolation is the method frequently used for increasing the sample rate by an integer multiple. To increase the sample rate by I, the basic interpolator inserts I−1 samples with a value of zero between every input sample. The resulting samples are then filtered through an anti-aliasing low pass filter at the higher rate.

The interpolation method has some of the same basic drawbacks as decimation. The rate increase is limited to an integer number and the low pass filtering, which is necessary for interpolation, is costly.

By themselves, interpolation and decimation can only achieve changes in sample rate of an integer number. In many cases, this does not give the necessary flexibility. By combining interpolation and decimation, perhaps in several stages, it becomes possible to fine tune the sample rate conversion. For example, if the input sample rate is 194.4 kHz and the desired sample rate is 153.6 kHz, the rates do not differ by an integer factor. Instead, the desired rate is related to the available rate by the ratio 64/81. To achieve the desired sample rate, the data may first be interpolated by a factor of 64 and then decimated by a factor of 81; however, large interpolation and decimation factors put very tough constraints on the required low pass filters. To reduce the filter requirements, the interpolation and decimation may be performed in several stages, for example: interpolation by 8, followed by decimation by 9, followed by interpolation by 8, followed by decimation by 9, resulting in a total of a 64/81 conversion. Using a combination of interpolation and decimation enables a wider range of rate conversions that is not limited to integer numbers. However, the big drawback of such an approach is the cost of filtering.

Another technique for sample rate conversion method that is useful when input and output rates are close is known as linear interpolation. This method uses a first order linear interpolation approach to estimate each output sample as a function of two input samples and the relative position in time of the input and output samples. Referring to FIG. 1, the value of the m:th output sample would be calculated according to the following formula:

$$y_m = x_n * k + x_{n+1} * (1-k)$$

where $$k = ((n+1)*T_x - m*T_y)/T_x$$

In these formulas, $x_n$ is the n:th input sample, $y_m$ is the m:th output sample, $T_x$ is the input sample period, and $T_y$ is the output sample period. Given $T_x$ is the input sample period, the time of the n:th input sample is: $tx_n = n*T_x$. Similarly, the time of the m:th output sample is: $ty_m = m*T_y$. To calculate output sample number m, chose n so that: $n*T_x \leq m*T_y < (n+1)*T_x$.

One drawback of the first order interpolation method is that it may be difficult to tell which particular input samples to use for calculation of an output sample. $T_x$ and $T_y$ are seldom integers and round off errors may cause the wrong samples to be chosen. The calculation of k, which involves the subtraction of two numbers that grow very large when m and n grow, also gets susceptible to errors due to limited numeric precision.

These drawbacks can be mitigated by using a table with k-values. Continuing with the example of 194.4 kHz input and 153.6 kHz output rate, the samples relative positions in time repeat over a period of 81 input samples. Thus, it is possible to pre-calculate and store the k-values in a table. Using a table would eliminate the need to calculate k for every sample at the expense of storing pre-calculated values. The drawback with using a pre-calculated table is that the values for the tables must be pre-calculated and stored, which requires additional hardware resources. This is particularly problematic when the same converter is to be used with various input sample rate and output sample rate combinations.

SUMMARY OF THE INVENTION

The present invention is a method and apparatus for sample rate conversion that overcomes some of the drawbacks of the prior art. The method of the present invention is an interpolation method that provides the robustness of a table based approach without the need to pre-calculate and store a table. The method also simplifies the calculations involved and is less sensitive to numeric round off errors. The method utilizes an integer accumulator to generate an output data stream including a plurality of output samples at one sample rate based on an input data stream including a plurality of input samples at another sample rate. More particularly, the method uses the integer accumulator to track the timing relation between input samples and output samples. Based on the value of the accumulator, the method determines if the correct input samples are being used to calculate the current output sample. If so, the output sample is calculated as a function of the input samples and the accumulator value. By employing simple integer arithmetics to maintain the accumulator value, the present inventive method avoids unnecessarily large computations otherwise required to confirm that the proper input samples are being used while maintaining the flexibility and compactness of a non-table based approach.

The apparatus of the present invention includes an input sample register, an integer accumulator, and preferably a bit shift register, all configured so as to practice the present inventive sample rate conversion method.

DETAILED DESCRIPTION OF THE INVENTION

Figure 1:
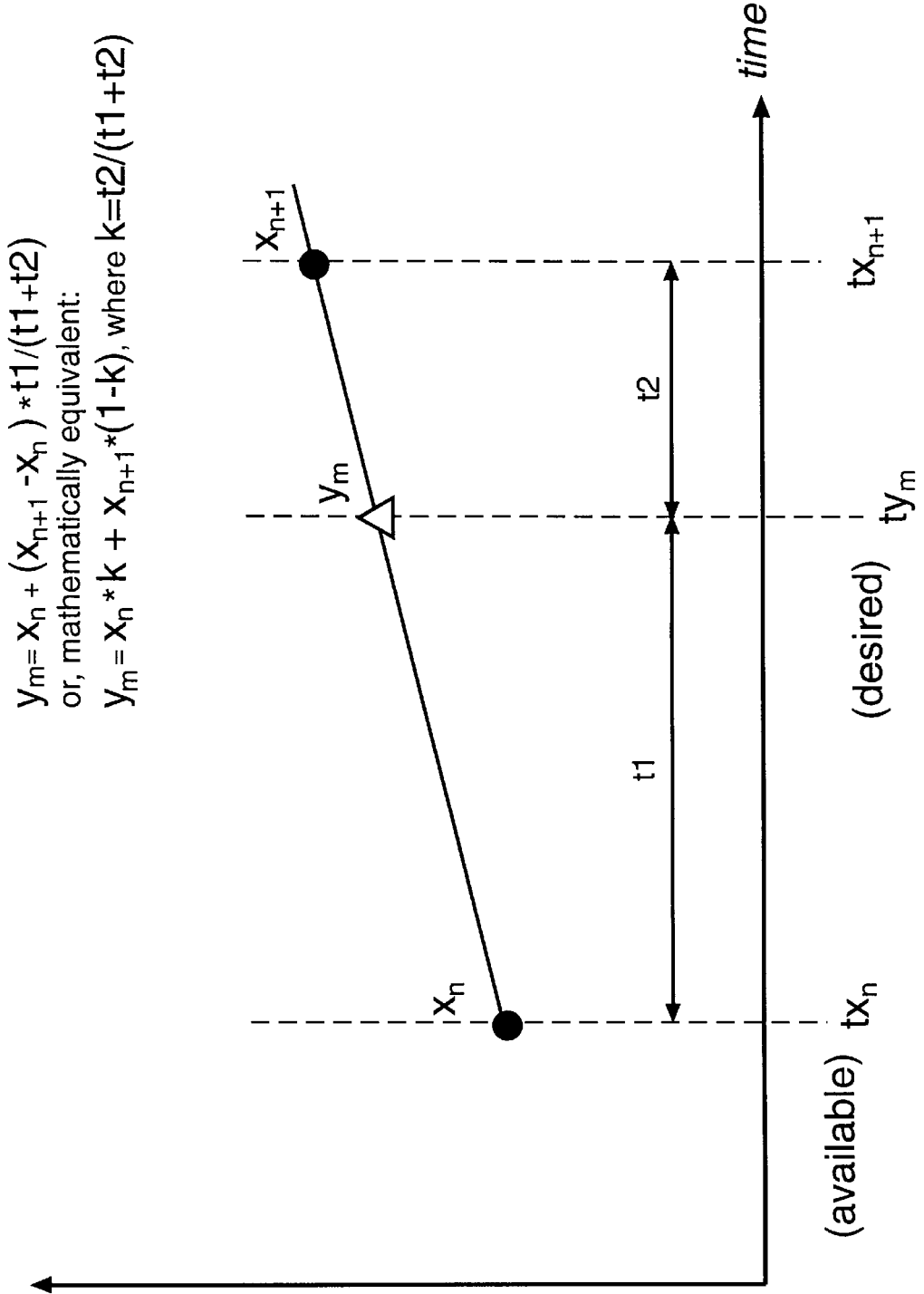
FIG. 1 is a diagram depicting linear interpolation.

The present invention is described more fully hereinafter by referring to the drawings, in which a preferred embodiment is depicted. However, the present invention can take on many different embodiments and is not intended to be limited to the embodiments described herein.

The present inventive method is a variation of interpolation that uses an integer accumulator 220 to facilitate calculation of the relative position in time of input and output samples. For linear interpolation, the method employs two positive integer constants, A and B, to calculate the timing relation of two input samples and one output sample. If the sample period of the input signal is $T_x$ and the sample period of the output signal is $T_y$, then A and B are chosen such that the ratio of A and B satisfies the following equation:

$$A/B = T_x/T_y$$

The actual value, or size, of A and B depends on the desired level of precision and other considerations. In effect, the input sample period $T_x$ is quantized into A steps. By keeping the steps small (keeping A large), the added quantization noise can be kept small. However, using a large number of bits to represent A may waste hardware resources. For example, assume that the input signal is available at a 194.4 kHz sample rate and the desired output sample rate is 153.6 kHz, then $$A/B = T_x/T_y = ((1/194,400)/(1/153,600)) = 153,600/194,400 = 64/81$$

Thus, the input sample period could be quantized into 64 steps (A=64), or any multiple of 64 steps and still maintain the proper ratio while allowing both A and B to be integers. Thus, A could be 1024 if B is 1296. However, if A is 64 then only 6 bits are required to represent the value ($2^6$=64), but if A is 1024, 10 bits are required ($2^{10}$=1024). Note that one additional bit may be required to represent sign for both.

The values of A and B are employed to iteratively calculate the value of a variable "acc" which tracks the relative positions in time for a pair of input samples and a given output sample. In simple terms, acc serves two functions. First, acc is used to determine if the proper pair of input samples is being used to calculate the current output sample. Second, acc is used to assign the proper weighting to each member of the input sample pair so as to properly estimate the output sample value. The details of how acc performs these functions will become apparent through the following description.

Figure 2:
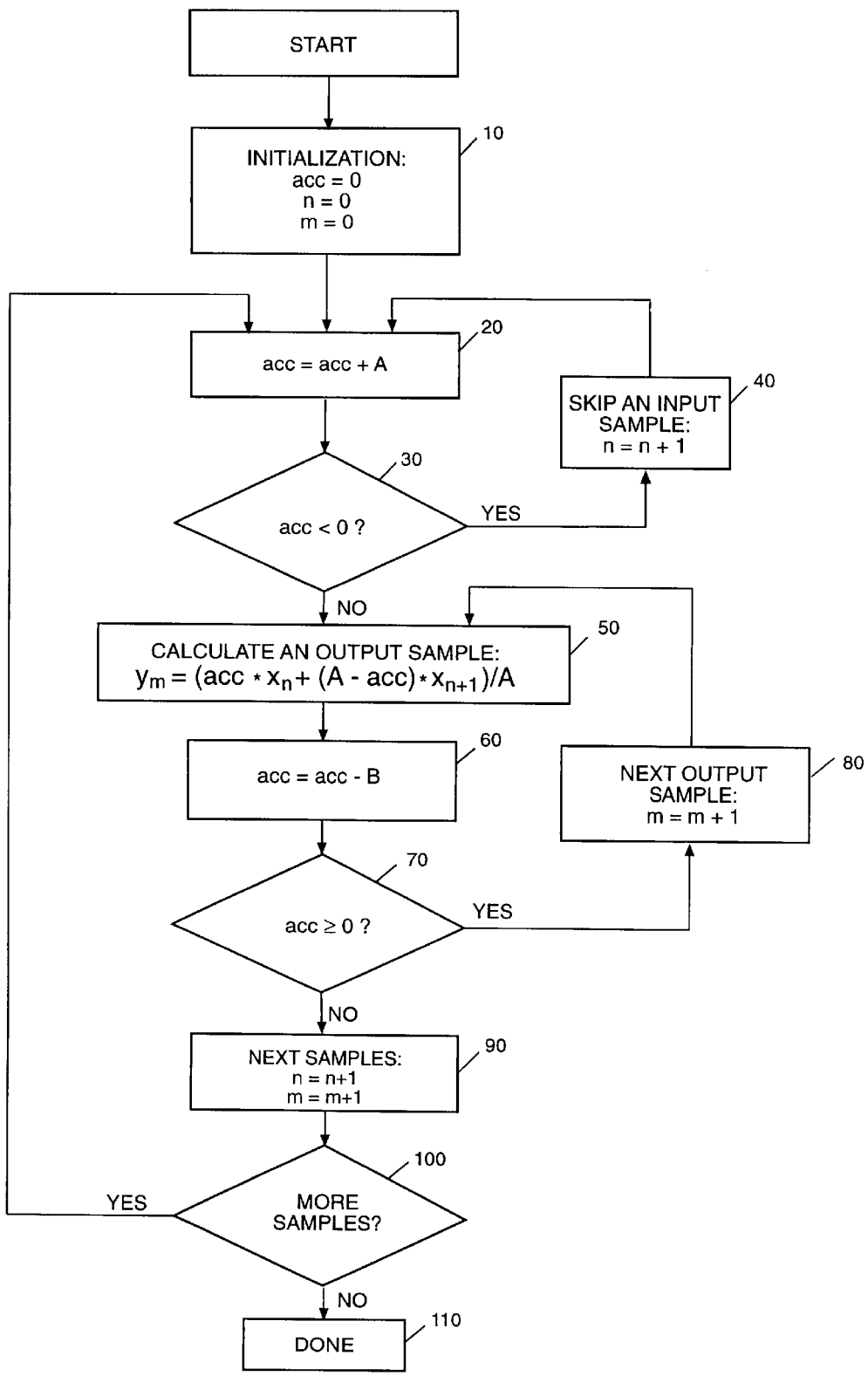
FIG. 2 is a logical flowchart of the present sample rate conversion method.

FIG. 2 shows a logical flow chart for the present invention. At the start of the process, the integer accumulator 220 is set to zero and the variables m and n are also set to zero (box 10). Variable m is an integer counter representing the sequence number of the current output sample. Variable n is an integer counter representing the sequence number of the current input sample. As will become apparent from the following description, the only purpose of m and n in the flow diagram is to aid the reader in understanding the algorithm by clarifying how the input and output samples are related. Neither m nor n need be stored or calculated to practice the present inventive method.

The accumulator 220 contains an integer value representing the variable "acc." The main processing loop begins by adding A to the integer value in the accumulator 220 (see box 20). Acc is then checked to see if it is less than zero (box 30). If so, then n is incremented by one (box 40), the next input sample is selected to assume the role of the current input sample, and the process returns to box 20. If acc is not less than zero, then the output sample is calculated (box 50). In simple terms, the acc value check of box 30 represents a determination of whether the particular output sample being calculated falls within the current input sample period, i.e., between the two currently selected input samples (n and n+1) or exactly at input sample $x_{n+1}$.

For purposes of the invention, the current input sample period is defined as the time period from the current input sample to the next subsequent input sample. Thus, if the input sample rate is 1 Hz, and the current input sample is number four (in the sequence zero, one, two, three, four, . . . n) then the current input sample period is from 4 seconds to 5 seconds.

Calculating the output sample (box 50) is accomplished via the formula:

$$y_m = (acc * x_n + (A - acc) * x_{n+1})/A$$

This formula is a modified linear interpolation formula. In this formula, $x_n$ is the value of the last input sample which occurs before the output sample and $x_{n+1}$ is the value of the first input sample after the output sample. In the situations where an output sample falls directly on top of an input sample, then acc will equal the integer zero and formula will collapse to $y_m = (A * x_{n+1})/A = x_{n+1}$. Thus, the value of the properly corresponding input sample, $x_{n+1}$, will be used for the output sample ($y_m$). Note, however, that for the special case of the very first instance of direct overlap, at the first input sample ($x_0$) and first output sample ($y_0$), acc will equal A, therefore the formula for this one instance will collapse to $y_0 = (A * x_0)/A = x_0$.

After the output sample is calculated (box 50), the value of acc is decremented by B (box 60). In box 70, this new value of acc is checked to see if it is greater than or equal to zero. If so, m is incremented by one and the process returns to box 50. If not, then the both m and n are incremented by one (box 90). In simple terms, the acc value check of box 70 represents a determination of whether the next output sample occurs within the same pair of input samples.

The process continues looping through the main processing loop (box 20–box 100) until there are no more samples (box 100), at which point it stops (box 110). In this manner the input sample rate of period $T_x$ is converted to an output sample rate of period $T_y$.

Figure 3:
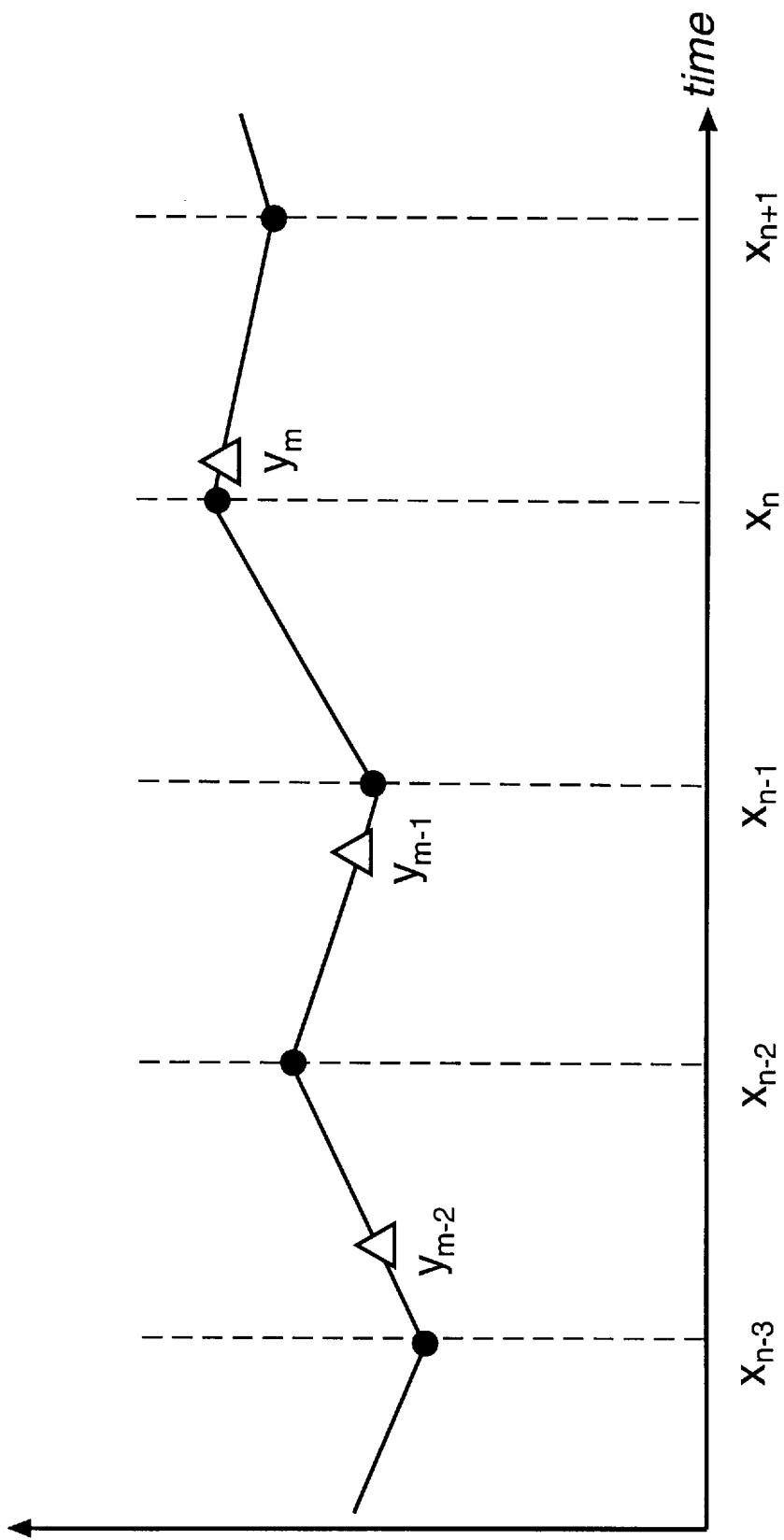
FIG. 3 is a diagram depicting the timing relation between input samples ( ... $x_{n-3}, x_{n-2}, x_{n-1}, x_n, x_{n+1}, ...$ ) and output samples ( ... $y_{m-2}, y_{m-1}, y_m, y_{m+1}, ...$ ).

As an example of the method in action, see FIG. 3. Assume that the input sample rate is faster than the output sample rate, meaning that A is smaller than B. For sake of discussion assume that A is 10 and B is 14, corresponding to an input sample rate of 1.4 kHz and an output sample rate of 1.0 kHz. Further, assume that the conversion process is proceeding according to the present invention and is now processing input sample $x_{n-3}$ and output sample $y_{m-2}$. At this point, entering box 20, acc equals −4. At box 20, acc is incremented by A such that acc now equals 6 (−4+10). Because 6 is larger than 0 (box 30), output sample $y_{m-2}$ is calculated (box 50) based on $x_{n-3}$ and $x_{n-2}$. Now, acc is decremented by 14 (box 60) so as to equal −8 (+6−14). Because acc is not greater than 0, the main process loop begins again. During this second pass through the main process loop, the value for $y_{m-1}$ is calculated using $x_{n-2}$ and $x_{n-1}$ and acc is adjusted to be −12 (−8+10−14). At the third pass through the main process loop, acc is incremented by A so as to equal −2 (−12+10). Now, because acc is still less than 0, the current input sample ($x_{n-1}$ at this point) is discarded, the next input sample $x_n$ assumes the position of current input sample, and acc is increased to 8 (−2+10). Output sample $y_m$ is then calculated using $x_n$ and $x_{n+1}$. At the conclusion of the third pass through the main process loop (box 100), acc equals −6 (8−14). As shown in FIG. 3, the reason input samples $x_n$ and $x_{n+1}$ were used to calculate output sample $y_m$ rather than input samples $x_{n-1}$ and $x_n$ is that $y_m$ fell between $x_n$ and $x_{n+1}$.

As can be seen from this explanation, the variable acc is used to dynamically track the timing relation between input samples and output samples. In this example, where A is less than B, the input sample sequence is advanced by an "extra" one or more position when acc is less than zero at box 30. In other situations, when B is less than A, two or more output samples may be calculated using the same input sample pair when acc is greater than or equal to zero in box 70. Thus, it can be seen that variable acc is used by the process to verify that the correct input sample pair is being used to calculate each given output sample.

Figure 4:
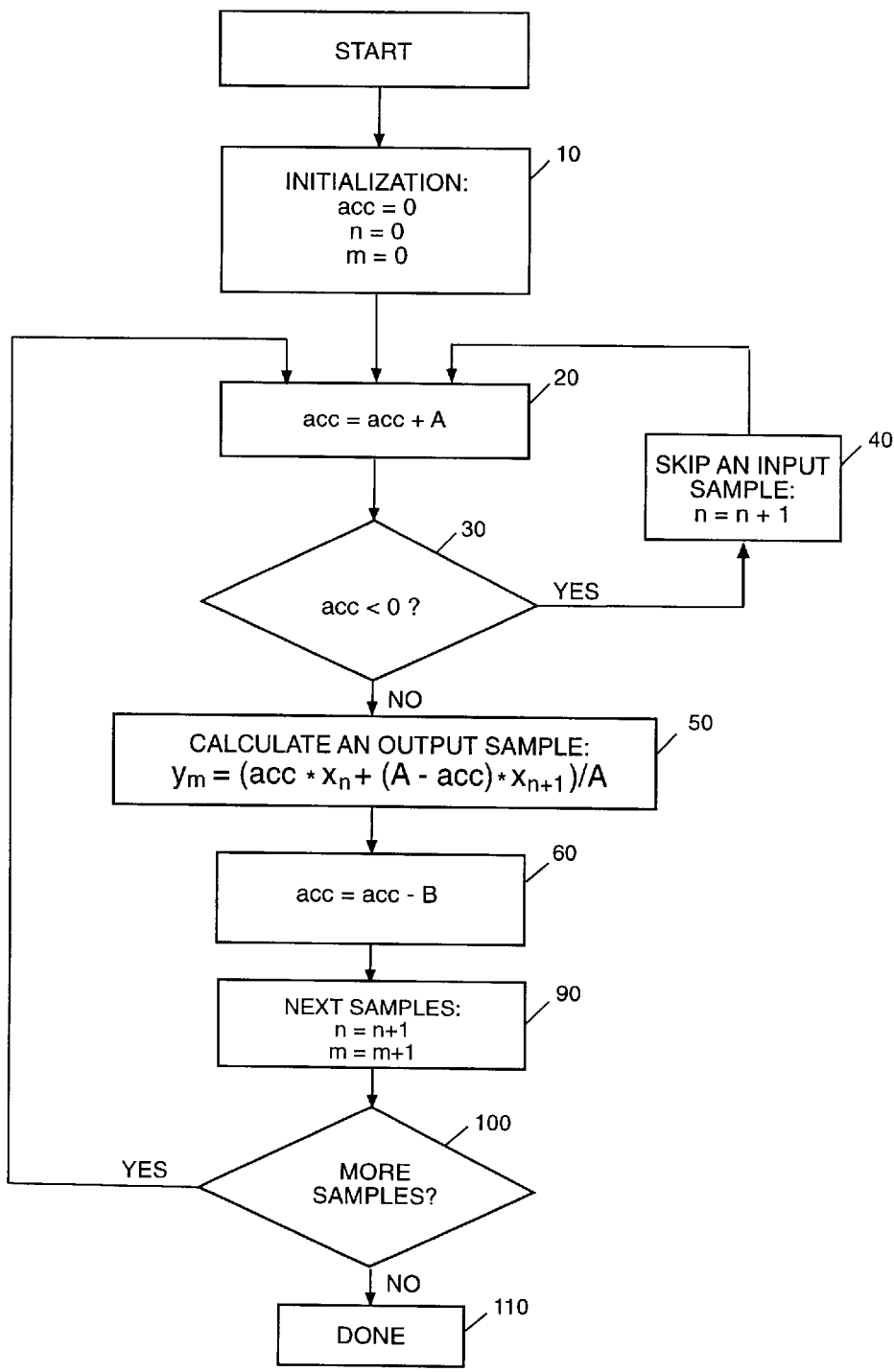
FIG. 4 is a logical flowchart of a simplified sample rate conversion method applicable when A is known to be smaller than B.
Figure 5:
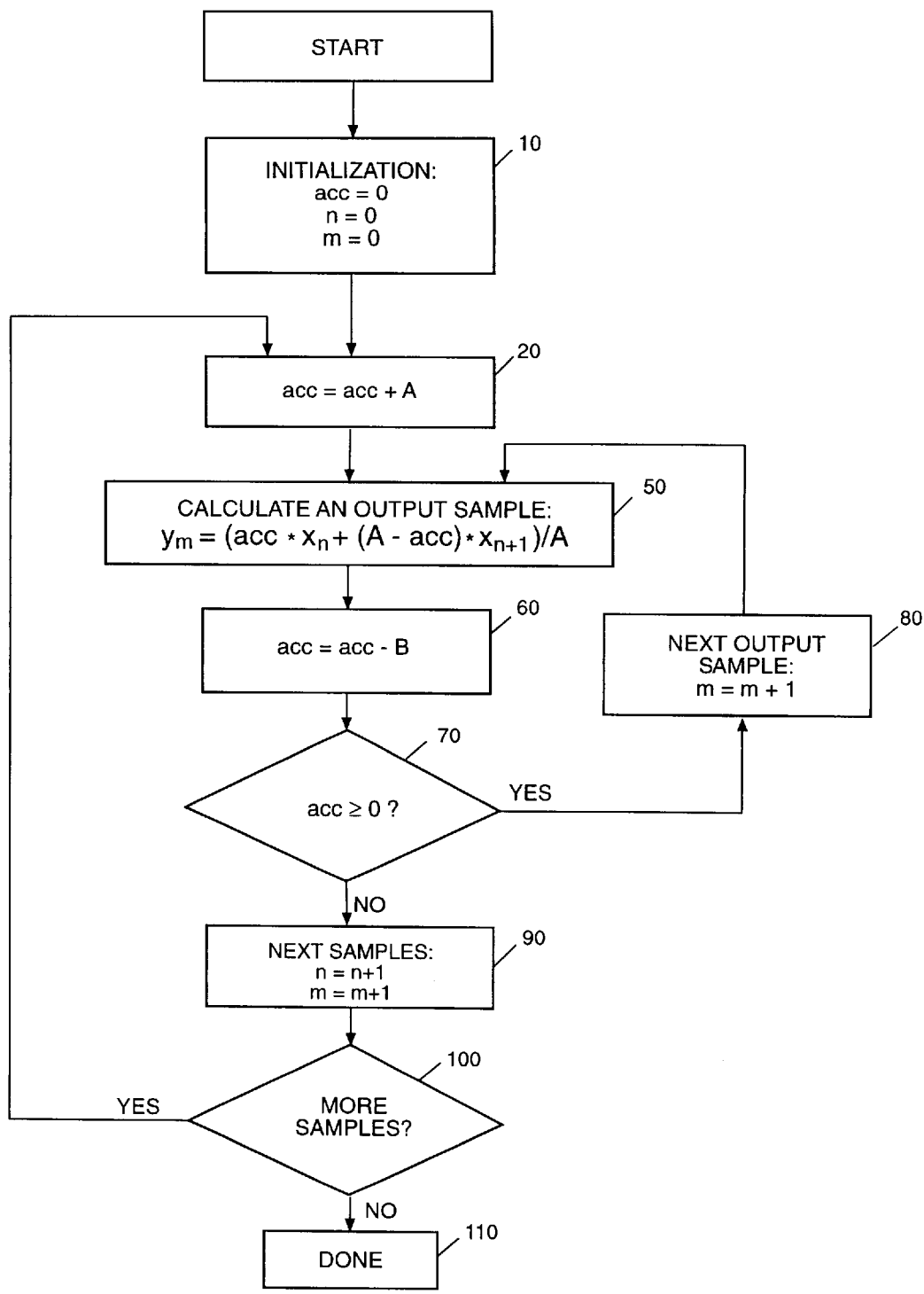
FIG. 5 is a logical flowchart of a simplified sample rate conversion method applicable when A is known to be larger than B.

The algorithm of FIG. 2 can be simplified slightly if the constant A is known to be greater than the constant B, or vice versa. Using the same reference numbers, FIG. 4 shows a simplified logical flow chart for when A is known to be smaller than B. FIG. 5 shows a simplified logical flow chart for when A is known to be larger than B. The flow charts of FIG. 4 and FIG. 5 show that a comparison and loop back step can be eliminated when the relationship between A and B is known, thereby simplifying the process.

For the above processes, the calculation of the output sample ($y_m$) calls for division by the constant A. Because division is sometimes expensive to implement in hardware, it is possible to pre-calculate the value of 1/A instead, and use multiplication. Alternatively, and more preferably, a value for A can be selected that enables easy division. For example, if A is a power of two, the division can be implemented as a simple binary bit shift.

For purposes of an example, assume that the input sample is available at 194.4 kHz and the desired sample rate is 153.6 kHz. This means that $$A/B = T_x/T_y = 153,600/194,400 = 64/81$$

Thus, A could equal 64 and B could equal 81. If so, then the input sample period $T_x$ would be divided into 64 steps. Greater precision could be obtained if, for example, A were increased to 1536 and B were correspondingly increased to 1944. Preferably, however, A would be a large power of two such as 1024 ($2^{10}$), meaning that B would be 1296. If A is 1024, then division could be implemented as a binary right shift of ten (10).

The discussion above assumes utilization of a linear interpolation approach. However, the present inventive method is can also be utilized for other interpolation approaches, such as second order or cubic or other methods known in the art. Some of these other interpolation approaches require the use of more than two input samples to calculate a given output sample. If only two input samples are required, then only one integer accumulator 220 need be employed. If more than two input samples are required, a plurality of integer accumulators 220 may be used to track the various timing relations between input samples and output samples. Alternatively, one accumulator 220 can be employed to track the relationship between all the input samples required and the output sample to be calculated; this is because once a timing relationship to one input sample is known, the timing relationship to the other input samples will simply be an integer increment of A farther away. If a different interpolation approach (other than linear) is used, obviously a different formula would also be employed to calculate each given output sample. However, the output sample value would still be a function of at least a plurality of input samples and one or more accumulator values.

Figure 6:
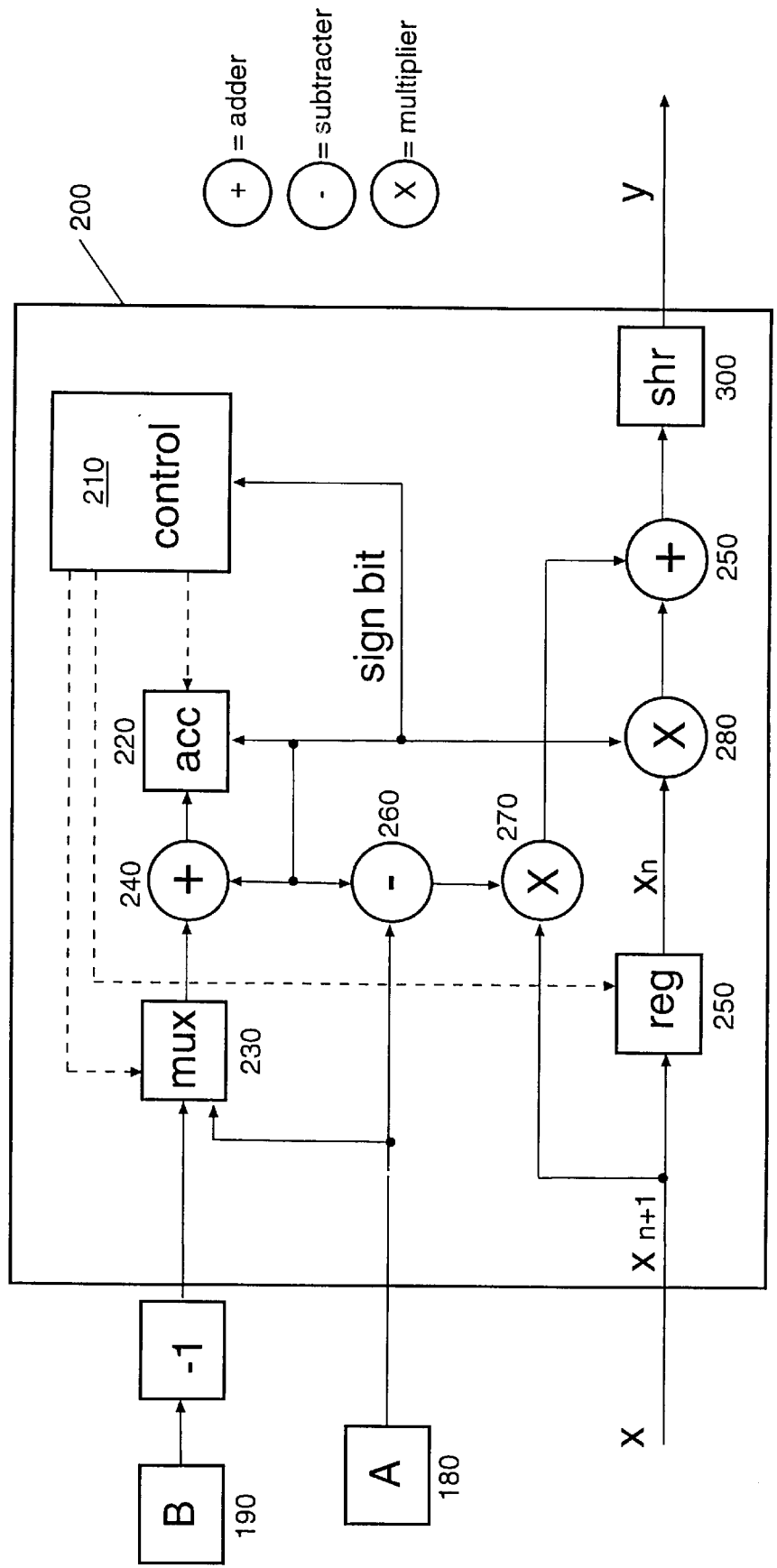
FIG. 6 is block diagram of a preferred embodiment of the apparatus for a sample rate converter.

A block diagram of a possible hardware implementation of the sample rate converter 200 is shown in FIG. 6. The sample rate converter 200 includes a controller 210, an integer accumulator 220, a multiplexer 230, adders 240, 250, a subtractor 260, multipliers 270, 280, an input sample register 290, and a bit shifter 300. The controller 210 controls the overall function of the converter 200. The accumulator 220 tracks the relative position in time of input and output samples using integer arithmetics. The multiplexer 230 is connected to sources 180, 190 for values of A and B. The input samples are sequentially fed to the register 290. The bit shifter 300 performs the appropriate bit shift to reflect division by A and outputs the output sample value for each output sample.

Alternatively, the functions of the controller 210 may be distributed within the converter 200 rather than collected in a single device as shown in FIG. 6. Also, two or more of the components of the converter 200, such as the adders 240, 250, subtractor 260, multipliers 270, 280, and input sample register 290 may be combined into an integrated arithmetic logic unit, but this may be more costly.

Figure 7:
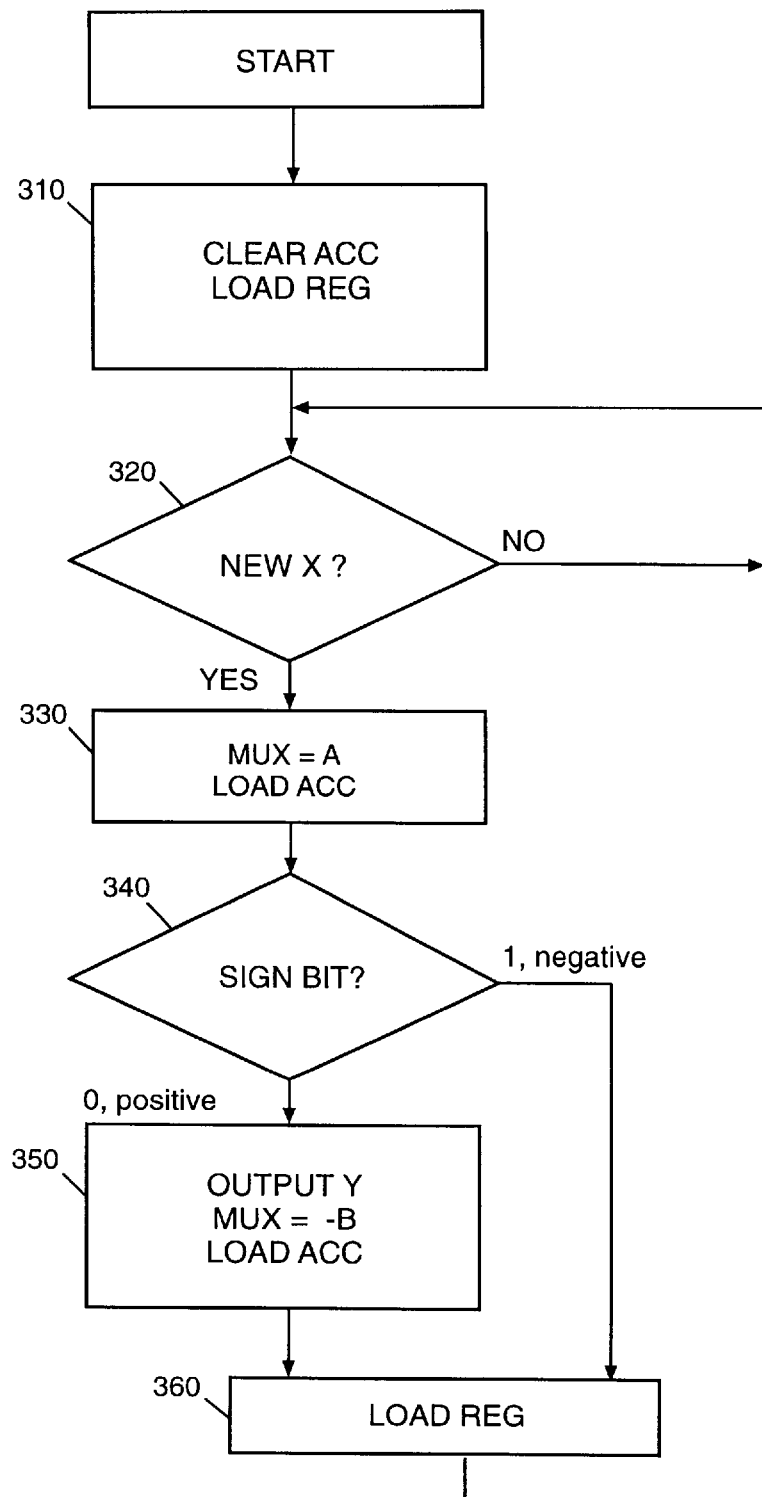
FIG. 7 is a logical flowchart of a preferred embodiment of the controller for the apparatus of FIG. 6 using the method of FIG. 4.
Figure 6:
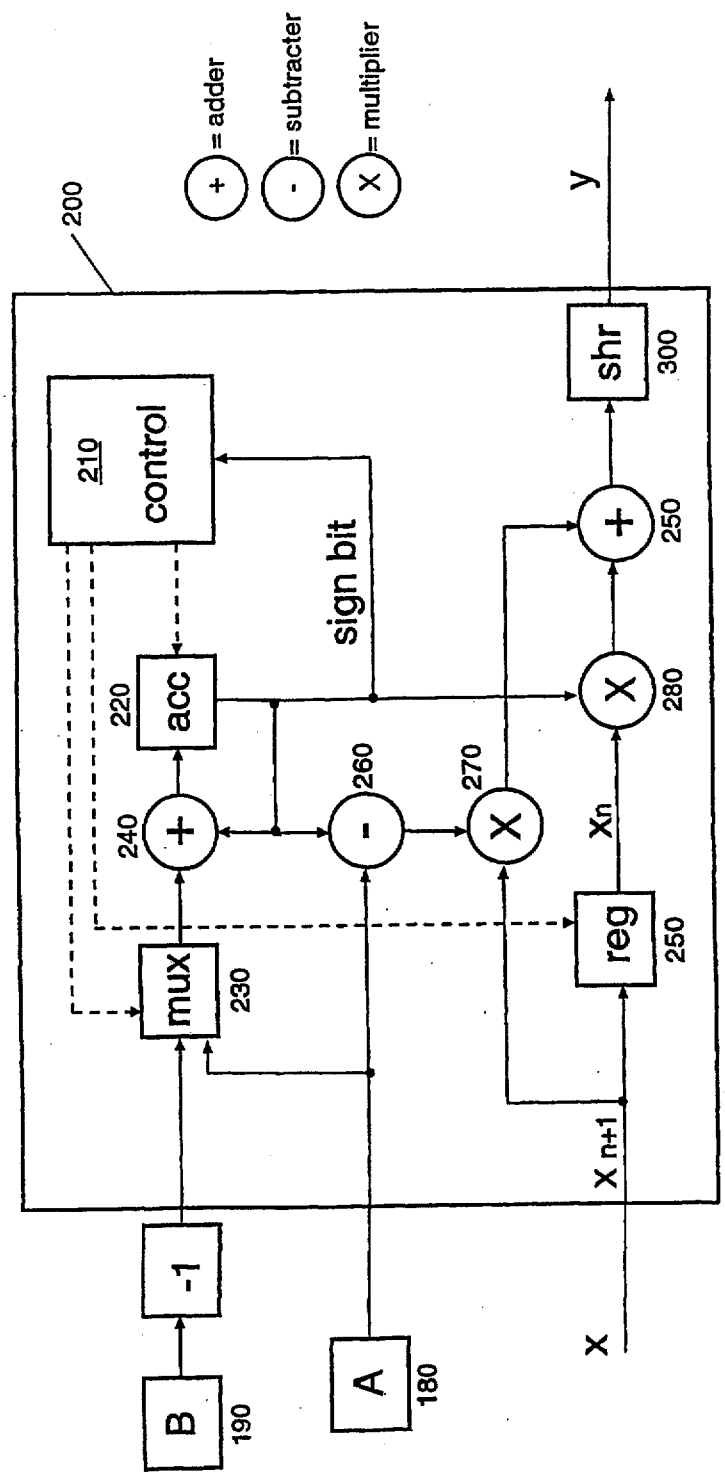

The FIG. 7 shows a simplified flowchart of the preferred operation of the controller 210 of FIG. 6 for the method described in FIG. 4. Upon initialization, the controller 210 instructs the accumulator 220 to clear and the input sample register 290 to load the first input sample (box 310). Note that this action corresponds to box 10 of FIG. 4. Then the controller 210 verifies that the next input sample is available (box 320). If not, the controller 210 loops until the next input sample is available. If so, then the controller 210 instructs the multiplexer 230 to load A and causes the accumulator 220 to increment by A (box 330). Note that this action corresponds to box 20 of FIG. 4. The controller 210 then checks the sign bit of the accumulator 220 (box 340). Note that this action corresponds to box 30 of FIG. 4. If the sign bit is positive, the controller 210 causes the output sample ($y_m$) to be calculated, the multiplexer to switch to −B, and the accumulator 220 to add −B to the existing accumulator value (box 350). These actions correspond to boxes 50, 60, and 90 of FIG. 4. Either after box 350 or if the sign bit is negative at box 340, the controller 210 causes the input sample register 290 to load the next input sample (box 360).

The converter 200 of FIG. 6 is a simple hardware implementation of the linear interpolation sample rate conversion method described above for when A is a power of two. The converter 200 is capable of converting the sample rate of an input sample stream of $x_1, x_2, \ldots x_n$ to an output sample stream of $y_1, y_2, \ldots y_m$ having a different output sample rate using integer arithmetics. By making A and B programmable constants, the same sample rate converter 200, may be programmed to operate at several different input to output sample ratios.

What I claim is:

1. A sample rate conversion method for converting an input data stream at a first sample rate to an output data stream at a second sample rate comprising:
   a) receiving the input data stream which includes a plurality of input samples at the first sample rate; and
   b) generating the output data stream which includes a plurality of output samples at the second sample rate by interpolation of said input samples; said generating step including:
      i) selecting one or more input samples in said input data stream;
      ii) maintaining at least one accumulator total which is indicative of the timing relationship between a selected input sample and the output sample to be generated, wherein the accumulator total is always an integer; and
      iii) for each output sample, calculating said output sample as a function of said accumulator total.

2. The method of claim 1 further comprising the step of comparing the accumulator total to a known reference value so as to determine if the currently selected input sample has the correct timing relationship to the output sample to be generated before said calculation step.

3. The method of claim 2 wherein said known reference value is zero.

4. The method of claim 1 wherein said calculating said output sample is a further function of said one or more input samples.

5. The method of claim 1 further comprising the step of maintaining a plurality of accumulator totals wherein each accumulator total is indicative of the timing relationship between a different input sample in said input data stream and the output sample to be generated and wherein each accumulator total is always an integer.

6. A sample rate conversion method for converting an input data stream at a first sample rate to an output data stream at a second sample rate comprising:
   a) receiving the input data stream which includes a plurality of input samples at the first sample rate; and
   b) generating the output data stream which includes a plurality of output samples at the second sample rate by linear interpolation of said input samples; said generating step including:
      i) maintaining at least one accumulator total which is indicative of the timing relationship between a current input sample in said input data stream and the output sample to be generated, wherein the accumulator total is always an integer; and
      ii) for each output sample, calculating said output sample as a function of the accumulator total.

7. The method of claim 6 further comprising the step of comparing the accumulator total to a known reference value so as to determine whether the output sample to be generated falls within a current input sample period before said calculating step.

8. The method of claim 7 wherein said known reference value is zero.

9. The method of claim 6 wherein said calculating said output sample is a further function of the current input sample and the next input sample.

10. The method of claim 9 further comprising the steps of:
    a) establishing integer values A and B such that the ratio A/B is equal to $T_x/T_y$ where $T_x$ is the input sample period and $T_y$ is the output sample period; and
    b) calculating the output sample value $Y_m$ of the m:th output sample according to the formula $$Y_m = (L*X_n + (A-L)*X_{n+1})/A$$

where L is the current value of said accumulator total, $X_n$ is the value of the current input sample, and $X_{n+1}$ is the value of the next input sample after $X_n$.

11. The method of claim 10 further comprising the step of decrementing the value of said accumulator total by B after calculating an output sample value.

12. The method of claim 10 further comprising the step of incrementing the value of said accumulator total by A before calculating an output sample value.

13. The method of claim 10 wherein A is a power of two.

14. A sample rate conversion method for converting an input data stream at a first sample rate to an output data stream at a second sample rate comprising:
    a) receiving the input data stream which includes a plurality of input samples at the first sample rate;
    b) generating the output data stream which includes a plurality of output samples at the second sample rate by linear interpolation of said input samples; said generating step including:
       i) establishing integer values A and B such that the ratio A/B is equal to $T_x/T_y$ where $T_x$ is the reciprocal of said first sample rate and $T_y$ is the reciprocal of said second sample rate;
       ii) maintaining an accumulator total which is indicative of the timing relationship between a current input sample in said input data stream and the output sample to be generated, wherein the accumulator total is always an integer; and
       iii) for each output sample, comparing the accumulator total to a known reference value so as to determine whether the output sample to be generated falls within a current input sample period; if so, calculating said output sample as a function of the accumulator total, the current input sample, and the next input sample according to the formula $$Y_m = (L*X_n + (A-L)*X_{n+1})/A$$

where $Y_m$ is the value of the m:th output sample, L is the current value of said accumulator total, $X_n$ is the value of the current input sample, and $X_{n+1}$ is the value of the next input sample after $X_n$; and
       iv) setting L to zero initially and then incrementing L by A before calculating the first output sample value and decrementing L by B after calculating each output sample value.

15. The method of claim 14 wherein A is a power of two.

16. The method of claim 14 wherein said known reference value is zero.

17. A sample rate converting device for converting an input data stream which includes a plurality of input samples at a first sample rate to an output data stream which includes a plurality of output samples at a second sample rate comprising:

a) an input sample register;

b) at least one integer accumulator, having an integer accumulator total therein for calculating the timing relation between input samples and output samples using integer arithmetics;

wherein the value of each of said output samples is calculated as a function of said accumulator total and two or more of said input samples.

18. The apparatus of claim 17 wherein said calculating is according to the formula:

$$Y_m = (L * X_n + (A-L) * X_{n+1})/A$$

where $Y_m$ is the value of the m:th output sample, L is the current value of said accumulator total, $X_n$ is the value of the current input sample, and $X_{n+1}$ is the value of the next input sample after $X_n$; and A is an integer value such that A and integer value B have a ratio A to B of $T_x$ to $T_y$ where $T_x$ is the reciprocal of said first sample rate and $T_y$ is the reciprocal of said second sample rate.

19. The device of claim 17 further comprising a bit shifter for the division portion of said calculating.

* * * * *

UNITED STATES PATENT AND TRADEMARK OFFICE
CERTIFICATE OF CORRECTION

PATENT NO. : 5,818,888
DATED : October 6, 1998
INVENTOR(S) : Holmqvist

It is certified that error appears in the above-identified patent and that said Letters Patent is hereby corrected as shown below:

The title page, showing the illustrative figure, should be deleted to appear as per the attached title page.

The drawing sheets consisting of Figs. 1 and 6, should be deleted to be replaced with the drawing sheets, consisting of Figs. 1 and 6, as shown on the attached pages.

Signed and Sealed this

Twenty-ninth Day of January, 2002

Attest:

Attesting Officer

JAMES E. ROGAN
Director of the United States Patent and Trademark Office

United States Patent [19]

Holmqvist

[11] Patent Number: 5,818,888

[45] Date of Patent: Oct. 6, 1998

[54] SAMPLE RATE CONVERTER

[75] Inventor: Peter Bo Holmqvist, Morrisville, N.C.

[73] Assignee: Ericsson, Inc., Research Triangle Park, N.C.

[21] Appl. No.: 806,853

[22] Filed: Feb. 26, 1997

[51] Int. Cl.$^6$ .................................................. H03M 7/00
[52] U.S. Cl. ........................... 375/355; 341/61; 364/724.1
[58] Field of Search ................................ 375/350, 355; 341/61; 364/724.1

[56] References Cited

U.S. PATENT DOCUMENTS

| | | | |
|---|---|---|---|
| 4,020,332 | 4/1977 | Crochiere et al. | 364/723 |
| 4,692,931 | 9/1987 | Ohsawa | 372/355 |
| 5,432,511 | 7/1995 | Sadjadian et al. | 341/61 |
| 5,481,267 | 1/1996 | Miyabe et al. | 341/61 |
| 5,497,152 | 3/1996 | Wilson et al. | 341/61 |
| 5,512,895 | 4/1996 | Madden et al. | 341/61 |
| 5,513,209 | 4/1996 | Holm | 375/354 |
| 5,559,513 | 9/1996 | Rothermel et al. | 341/61 |
| 5,596,609 | 1/1997 | Genrich et al. | 375/350 |
| 5,606,319 | 2/1997 | Yatim et al. | 341/144 |
| 5,610,942 | 3/1997 | Chen et al. | 375/242 |
| 5,617,088 | 4/1997 | Yasuda | 341/61 |
| 5,621,404 | 4/1997 | Heiss et al. | 341/61 |
| 5,731,769 | 3/1998 | Girardeau, Jr. et al. | 341/61 |

*Primary Examiner*—Young T. Tse
*Attorney, Agent, or Firm*—Rhodes, Coates & Bennett, L.L.P.

[57] ABSTRACT

A sample rate converter is described for converting an input data stream including a plurality of input samples at one sample rate to an output data stream including a plurality of output samples at another sample rate. The converter uses an interpolation approach that utilizes an integer accumulator to track the timing relation between input samples and output samples. Based on the value of the accumulator, the method determines if the correct input samples are being used to calculate the current output sample. If so, the output sample is calculated as a function of the input samples and the accumulator value. The converter provides the robustness of a table based conversion approach without the need to pre-calculate and store a table, simplifies the calculations involved, and is less sensitive to numeric round off errors.

19 Claims, 7 Drawing Sheets

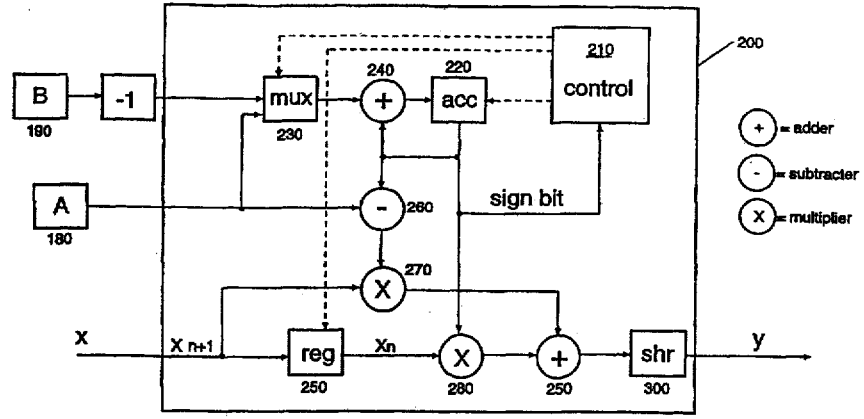

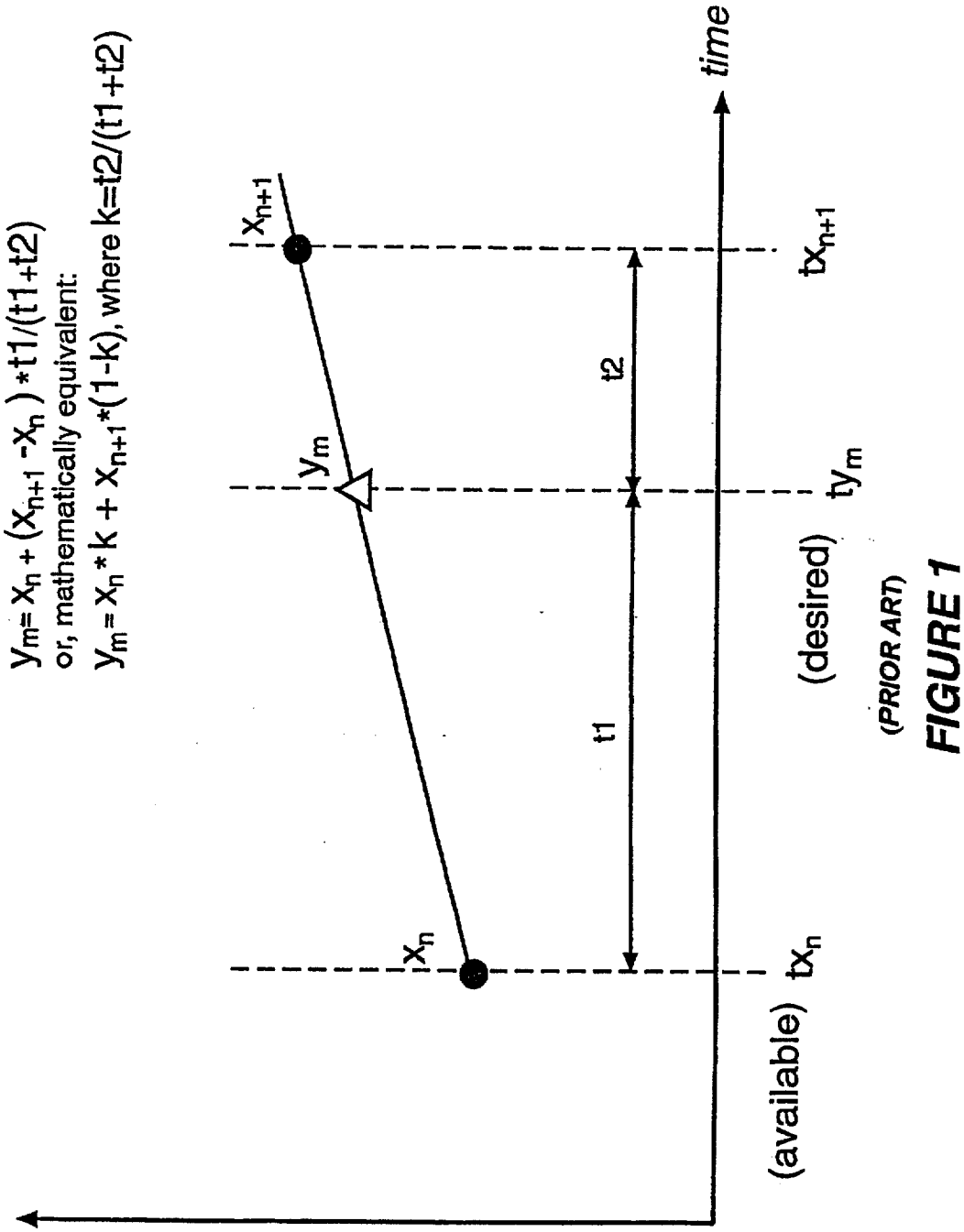
*(PRIOR ART)* FIGURE 1